(12) United States Patent
Takamatsu et al.

(10) Patent No.: US 11,073,571 B2
(45) Date of Patent: Jul. 27, 2021

(54) GROUND FAULT DETECTION APPARATUS

(71) Applicant: Yazaki Corporation, Tokyo (JP)

(72) Inventors: Hiroaki Takamatsu, Makinohara (JP); Yoshihiro Kawamura, Makinohara (JP); Hisashi Takahashi, Sagamihara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/864,324

(22) Filed: May 1, 2020

(65) Prior Publication Data
US 2020/0386827 A1 Dec. 10, 2020

(30) Foreign Application Priority Data

Jun. 4, 2019 (JP) .............................. JP2019-104432

(51) Int. Cl.
*G01R 31/52* (2020.01)
*G01R 31/3835* (2019.01)
*G01R 31/64* (2020.01)

(52) U.S. Cl.
CPC ......... *G01R 31/52* (2020.01); *G01R 31/3835* (2019.01); *G01R 31/64* (2020.01)

(58) Field of Classification Search
CPC ..... G01R 31/52; G01R 31/3835; G01R 31/64

USPC .......................................................... 324/509
See application file for complete search history.

(56) References Cited

U.S. PATENT DOCUMENTS 8,198,902 B2 * 6/2012 Kawamura ............ G01R 31/52
324/551

FOREIGN PATENT DOCUMENTS

JP           2011-017586 A      1/2011

* cited by examiner

*Primary Examiner* — Farhana A Hoque
(74) *Attorney, Agent, or Firm* — Sughrue Mion, PLLC

(57) ABSTRACT

A ground fault detection apparatus includes a capacitor, switches for switching between a V0 charge path including the battery and the capacitor, a Vcn charge path including the battery, the capacitor and negative-side insulation resistance as insulation resistance between negative side of the battery and ground, a Vcp charge path including the battery, the capacitor and positive-side insulation resistance as insulation resistance between positive side of the battery and ground, and a charge voltage measurement path including the capacitor and a measurement resistor, an offset voltage divider circuit that divides and offsets voltage produced at the measurement resistor, a control device that controls the switches and calculates the insulation resistance using output voltage of the offset voltage divider circuit as a measured value, based on V0 measured at the V0 charge path, Vcn measured at the Vcn charge path and Vcp measured at the Vcp charge path.

3 Claims, 9 Drawing Sheets

GROUND FAULT DETECTION APPARATUS

TECHNICAL FIELD

The present invention relates to a ground fault detection apparatus using a flying capacitor.

BACKGROUND

In a vehicle such as a hybrid car, which includes an engine and an electric motor as driving sources, and an electric vehicle, a battery mounted on a vehicle body is charged, and driving power is generated with the use of electric energy supplied from the battery. In general, a power supply circuit related to the battery is configured as a high-voltage circuit using as high voltage as 200V or higher, and in order to ensure safety, the high-voltage circuit including the battery is in an ungrounded configuration in which the high-voltage circuit is electrically insulated from a vehicle body serving as a reference potential point of a ground.

Further, there is a vehicle including a step-up converter configured to step up a positive electric potential of a battery and supply it to a load to improve a drive efficiency of the load. In the vehicle including the step-up converter, an output side of the battery, i.e., a primary side of the step-up converter and an output side of the step-up converter, i.e., the secondary side of the step-up converter are in the ungrounded configuration in which they are electrically insulated from a vehicle body, thus the vehicle is not used as a ground for the battery and the step-up converter. Thus, the vehicle including the step-up converter requires detecting an insulation resistance between the battery and a ground and also an insulation resistance between the secondary side of the step-up converter and a ground to monitor a ground fault state.

Thus, a ground fault detection apparatus is provided to monitor a ground fault state between the vehicle body and a system provided with the battery and the step-up converter, specifically, a main power supply system ranging from the battery through the step-up converter to the load such as an electric motor. As the ground fault detection apparatus, one of a type using a capacitor called a flying capacitor is widely used.

FIG. 8 is a block diagram showing a configuration example of a conventional ground fault detection apparatus 500 of the flying capacitor type. The ground fault detection apparatus 500 is connected to an ungrounded battery B and is configured to detect ground fault of a system provided with the battery B and a step-up converter 520. The ground fault detection apparatus 500, the step-up converter 520 and a load 540 and such are controlled by an external control device as a host device not shown.

Herein, an insulation resistance between a positive electrode on an output side of the battery B, i.e., a primary side, and a ground is referred to as RLp1, and an insulation resistance between a negative electrode on that side and the ground is referred to as RLn1. Further, an insulation resistance between the positive electrode on an output side of the step-up converter 520, i.e., a secondary side, and the ground is referred to as RLp2, and an insulation resistance between the negative electrode on that side and the ground is referred to as RLn2. A positive electrode-side insulation resistance RLp is a combined resistance of the resistances RLp1 and RLp2, and a negative electrode-side insulation resistance RLn is a combined resistance of the resistances RLn1 and RLn2. A combined resistance of the positive electrode-side insulation resistance RLp and the negative electrode-side insulation resistance RLn corresponds to an insulation resistance RL of the system.

A capacitor C1 functioning as a flying capacitor is charged in a path formed by turning on and off of switches S1-S4, and its charge voltage is measured by a control device 510.

As a method for acquiring the insulation resistance RL, a technology is known in which V0, Vcn and Vcp are measured, (Vcn+Vcp)/V0 is calculated, and based on the obtained calculated value, the insulation resistance RL is obtained with referring to a pre-produced table data. The ground fault detection apparatus 500 determines that a ground fault is occurring when the obtained insulation resistance RL is below a predetermined reference value, and outputs a warning to the external control device.

Herein, V0 is a value corresponding to a voltage of the battery B measured with a path formed by turning on the switch S1 and the switch S2. Of electrode plates of the capacitor C1, one connected to the positive electrode side of the battery B is referred to as a first electrode plate, and one connected to the negative electrode side of the battery B is referred to as a second electrode plate.

Vcn is a voltage value measured with a charge path on the positive electrode side of the battery B formed by turning on the switch S1 and the switch S4, and is a voltage value having the effect of the negative electrode-side insulation resistance RLn. Vcp is a voltage value measured with a charge path on the negative electrode side of the battery B formed by turning on the switch S2 and the switch S3, and is a voltage value having the effect of the positive electrode-side insulation resistance RLp.

In general, in a ground fault determination, measurement is performed with one cycle including a V0 measurement, a Vcn measurement, a V0 measurement and a Vcp measurement, and at the time of switching of each measurement, a charge voltage of the capacitor C1 is read out and discharge of the capacitor C1 is performed with a path formed by turning on the switch S3 and the switch S4.

When measuring Vcn by turning on the switch S1 and the switch S4 while the step-up converter 520 is performing a step-up conversion operation, a voltage obtained by dividing a stepped-up voltage by the positive electrode-side insulation resistance RLp and the negative electrode-side insulation resistance RLn is applied to the second electrode plate of the capacitor C1.

When this voltage becomes higher than a voltage applied from the positive electrode side of the battery B, the capacitor C1 will be charged with a reverse polarity that is reverse of the normal polarity due to current flowing around. That is, the second electrode plate side will have a higher electrical potential, and a voltage applied to a resistor R3 which is a measurement resistor becomes negative. In this case, a voltage measured by the control device 510 becomes zero because the measurement range of the control device 510 is generally for positive electrical potential, and therefore, the insulation resistance RL cannot be calculated.

To address this problem, Patent Document 1 listed below discloses a ground fault detection apparatus 600 including a negative potential measurement circuit 620 as shown in FIG. 9. Here, the negative potential measurement circuit 620 includes a diode Da, a resistor Ra, a switch Sa constituted of a photo MOS-FET and a resistor Rb. In addition, the ground fault detection apparatus 600 includes a switch S5 and a resistor R5.

When a capacitor C1 is charged with a reverse polarity that is reverse of the normal polarity during the measurement of Vcn, the ground fault detection apparatus 600 measures a charge voltage of the capacitor C1 using an A/D2 of a control device 610 by turning on the switch S5 and the switch Sa, instead of measuring the charge voltage of the capacitor C1 using the A/D1 of the control device 610 by turning on the switch S3 and the switch S4. As such, the charge voltage of the capacitor C1 charged with the reverse polarity can be measured, and the insulation resistance RL can be calculated.

PRIOR ART DOCUMENT

Patent Document

Patent Document 1: JP 2011-17586 A

SUMMARY OF THE INVENTION

Problem to be Solved

In Patent Document 1, by providing the negative potential measurement circuit including the diode, the resistors and the switches, it is possible to measure the charge voltage of the capacitor in the ground fault detection apparatus of the system having the step-up converter even if the flying capacitor is charged with the reverse polarity. However, since the negative potential measurement circuit is an additional circuit used only when the flowing around of current has occurred due to the stepping up of voltage, and since the negative potential measurement circuit requires a separate control of the switch Sa, it is preferable to omit the negative potential measurement circuit to avoid the configuration from being complicated.

In addition, in the configuration shown in FIG. 8, if both of the switch S1 and the switch S3 are turned on due to failure and such, then the buttery B and the control device 610 are connected without the resistor therebetween, causing the risk that the control device 610 is exposed to a high voltage. To address this, there has been proposed a ground fault detection apparatus 700 as shown in FIG. 10 that is configured so as not to connect the switch S1 and the switch S3 without a resistor therebetween to protect the control device 710. However, in such ground fault detection apparatus 700, since a diode D0 is provided therein, the current cannot flow in a direction from a first electrode plate of a capacitor C1 to the diode D0. Hence, even when the voltage applied to a second electrode plate of the capacitor C1 has became higher than the voltage applied from the positive electrode side of the battery B, the current will not flow to the capacitor C1, and thus the capacitor C1 cannot be charged. Consequently, even if the negative potential measurement circuit as shown in FIG. 9 is added to the ground fault detection apparatus 700 shown in FIG. 10, the insulation resistance RL cannot be obtained when the voltage applied to the second electrode plate of the capacitor C1 is higher than the voltage applied from the positive electrode side of the battery B.

In view of the above-described drawbacks, an object of the present invention is to enable, with a simple configuration, a measurement of a charge voltage regardless of a charge direction of a flying capacitor.

Solution to Problem

In order to achieve the above-described object, the present invention provides, in one aspect, a ground fault detection apparatus configured to be connected to an ungrounded battery for supplying power to a load via a step-up circuit, and configured to detect a ground fault by calculating an insulation resistance of a system provided with the battery, the ground fault detection apparatus including: a capacitor configured to operate as a flying capacitor; a set of switches configured to switch between a first voltage (V0) charge path including the battery and the capacitor, a second voltage (Vcn) charge path including the battery, the capacitor and a negative electrode-side insulation resistance as an insulation resistance between a negative electrode side of the battery and a ground, a third voltage (Vcp) charge path including the battery, the capacitor and a positive electrode-side insulation resistance as an insulation resistance between a positive electrode side of the battery and the ground, and a charge voltage measurement path including the capacitor and a measurement resistor; an offset voltage divider circuit that divides and offsets a voltage produced at the measurement resistor; and a control device configured to control the set of switches and calculate the insulation resistance using an output voltage of the offset voltage divider circuit as a measured value, based on a first voltage (V0) which is a value measured at the first voltage (V0) charge path, a second voltage (Vcn) which is a value measured at the second voltage (Vcn) charge path and a third voltage (Vcp) which is a value measured at the third voltage (Vcp) charge path.

The offset voltage divider circuit may includes an input to which a voltage produced at the measurement resistor is inputted, an output that outputs the output voltage, a first resistor connected between the input and the output, a voltage source that supplies a constant voltage, a second resistor having one end connected to the voltage source and another end connected to a line that connects the first resistor and the output, and a third resistor having one end grounded and another end connected to the line that connects the first resistor and the output. Further, the third resistor may be constituted of two resistors, and a resistance value of the first resistor, a resistance value of the second resistor, and each resistance value of each of the two resistors constituting the third resistor may be equal.

Advantageous Effect of the Invention

According to the present invention described above, it is possible to perform, with a simple configuration, a measurement of a charge voltage regardless of a charge direction of a flying capacitor.

DETAILED DESCRIPTION OF THE EXEMPLARY EMBODIMENTS

Figure 1:
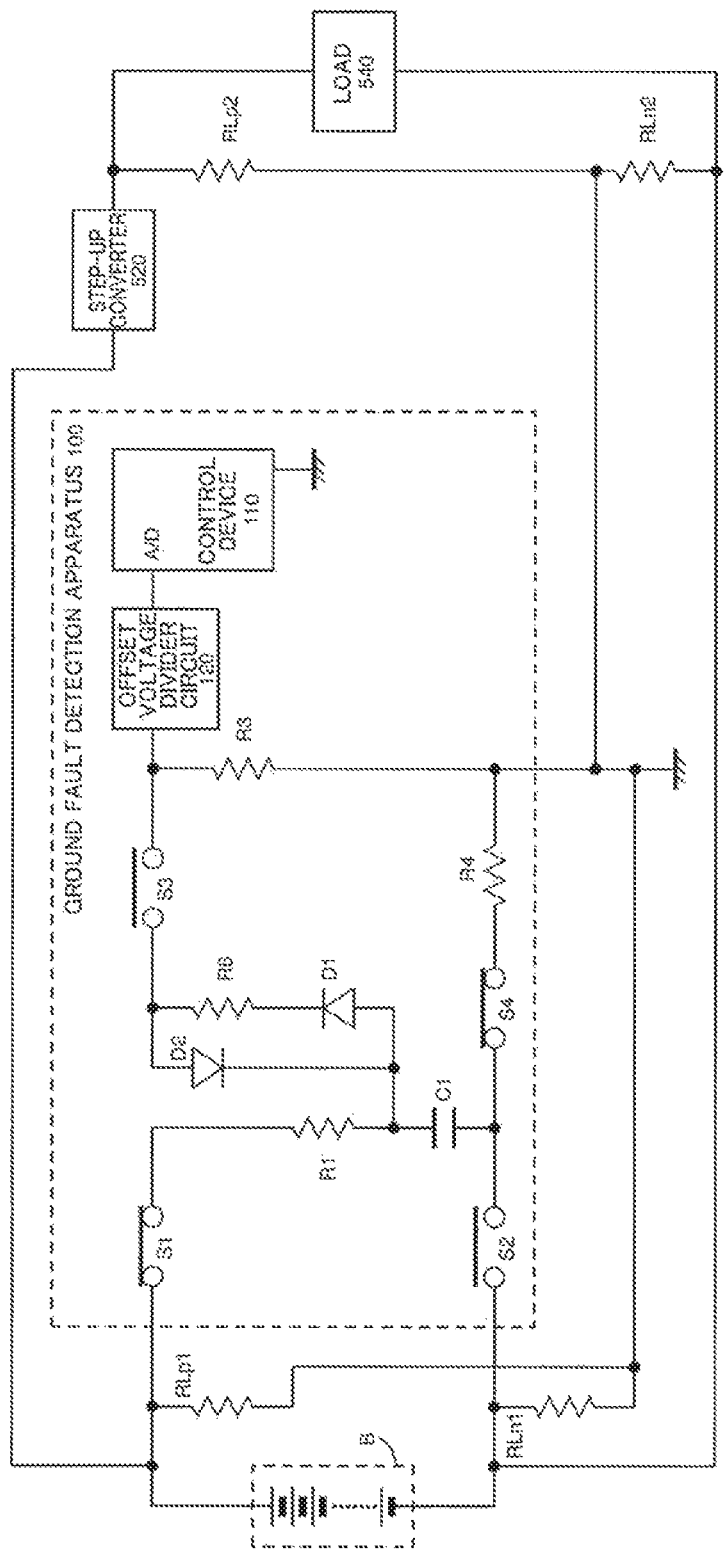
FIG. 1 is a block diagram showing a configuration of a ground fault detection apparatus according to this embodiment.

In the following, a ground fault detection apparatus according to an embodiment of the present invention will be explained with reference to the drawings. FIG. 1 is a block diagram showing a configuration of a ground fault detection apparatus 100 according to this embodiment. The ground fault detection apparatus 100 is configured to be connected to an ungrounded battery B that supplies power to a load 540 and is configured to detect a ground fault of a system provided with the battery B and a step-up converter 520. The ground fault detection apparatus 100, the step-up converter 520 and the load 540 and such are controlled by an external control device as a host device not shown.

Herein, an insulation resistance between a positive electrode on an output side of the battery B, i.e., a primary side, and a ground is referred to as RLp1, and an insulation resistance between a negative electrode on that side and the ground is referred to as RLn1. Further, an insulation resistance between the positive electrode on an output side of the step-up converter 520, i.e., a secondary side, and the ground is referred to as RLp2, and an insulation resistance between the negative electrode on that side and the ground is referred to as RLn2. A positive electrode-side insulation resistance RLp is a combined resistance of the resistances RLp1 and RLp2, and a negative electrode-side insulation resistance RLn is a combined resistance of the resistances RLn1 and RLn2. A combined resistance of the positive electrode-side insulation resistance RLp and the negative electrode-side insulation resistance RLn corresponds to an insulation resistance RL of the system.

The battery B is constituted of a chargeable battery such as a lithium-ion battery, and the positive electrode of the battery B is connected to a positive electrode of the load 540 such as an electric motor via the step-up converter 520, and the negative electrode of the battery B is connected to a negative electrode of the load 540.

As shown in FIG. 1, the ground fault detection apparatus 100 includes a capacitor C1 that functions as a flying capacitor.

The ground fault detection apparatus 100 includes four switches S1-S4 arranged around the capacitor C1 to switch measurement paths and to control charge and discharge of the capacitor C1. These switches may be constituted of switching elements of an insulated type such as photo MOS-FETs.

Figure 10:
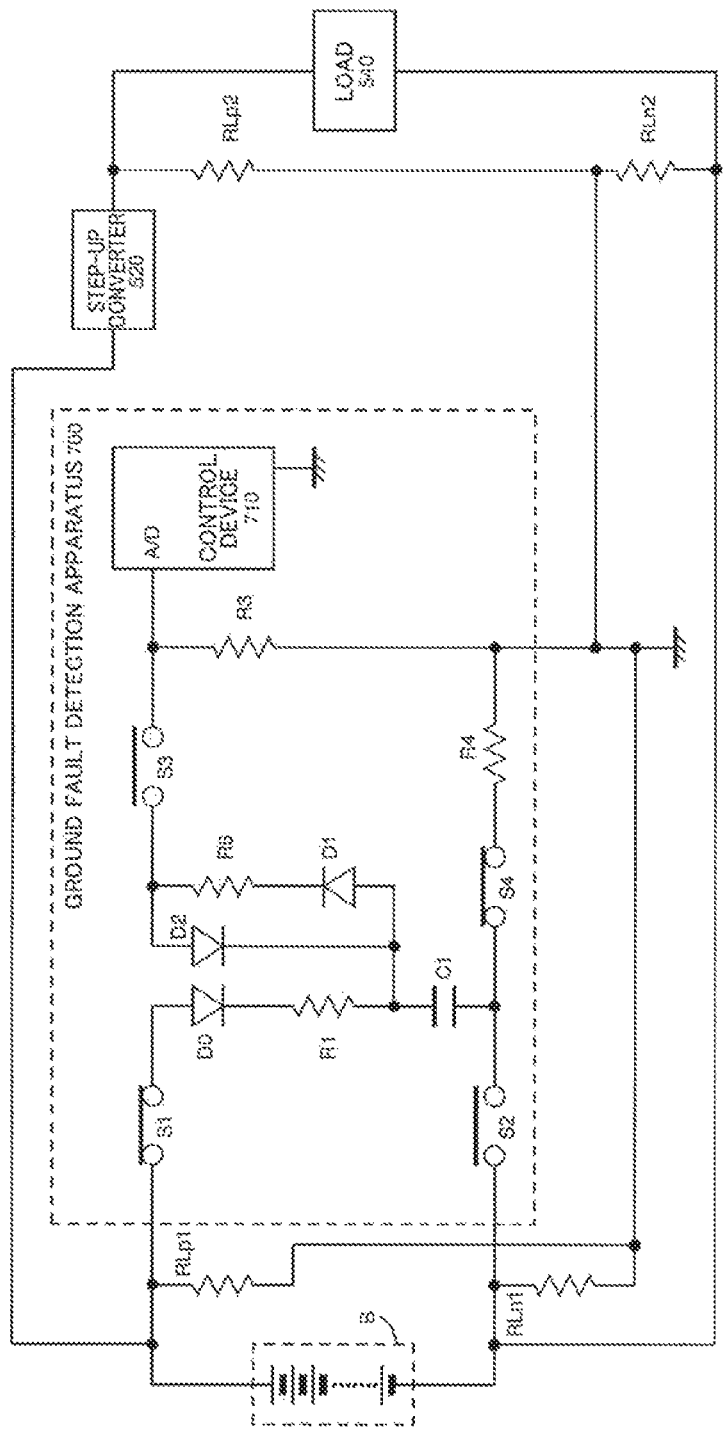
FIG. 10 is a block diagram showing a conventional configuration for protecting a control device from high voltage.

The switch S1 has one end connected to the positive electrode of the battery B and another end connected to one end of a resistor R1. Another end of the resistor R1 is connected to a first electrode plate of the capacitor C1. As shown in FIG. 10, a conventional art includes a diode provided between the switch S1 and the resistor R1 with a forward direction of the diode corresponding to a direction from the positive electrode of the battery B to the capacitor C1, however this diode is omitted in this embodiment. Thus, in this embodiment, the capacitor C1 will be charged with a reverse polarity that is reverse of the normal polarity when the voltage applied to a second electrode plate of the capacitor C1 is greater than a voltage applied from the positive electrode side of the battery B.

The first electrode plate of the capacitor C1 is also connected to one end of a parallel circuit formed of a diode D1 and a diode D2 to which a resistor R6 is connected in series. The diode D1 and the diode D2 are connected such that their forward directions are opposite, and an anode of the diode D1 is connected to the first electrode plate side of the capacitor C1.

One end of the switch S3 is connected to another end of the parallel circuit formed of the diode D1 and the diode D2 to which the resistor R6 is connected in series, and another end of the switch S3 is connected to one end of a resistor R3. Another end of the resistor R3 is grounded. Thus, the voltage of the first electrode plate of the capacitor C1 is divided across the resistor R6 and the resistor R3. In general, since the battery B has a high voltage, a voltage charged to the capacitor C1 is also a high voltage. Thus, in this embodiment, in order to reduce a voltage that is measured by a control device 110, the voltage of the first electrode plate of the capacitor C1 is divided with the resistor R6 and the resistor R3.

One end of an offset voltage divider circuit 120 is connected to a line that connects the switch S3 and the resistor R3, and another end of the offset voltage divider circuit 120 is connected to an A/D port of the control device 110. The offset voltage divider circuit 120 is a circuit that divides and offsets the voltage applied to the resistor R3. That is, the offset voltage divider circuit 120 is a circuit that divides the voltage $V_{R3}$ applied to the resistor R3 into a voltage that is "a" times the voltage $V_{R3}$ (wherein, 0<a<1), and offsets (i.e., shifts) the voltage to a voltage that is greater for a predetermined voltage b (wherein, b>0). The voltage $(aV_{R3}+b)$ obtained by dividing and offsetting the voltage applied to the resistor R3 will be measured by the control device 110.

The switch S2 includes one end connected to the negative electrode of the battery B, and another end connected to the second electrode plate of the capacitor C1. The switch S4 includes one end connected to the second electrode plate of the capacitor C1, and another end connected to one end of the resistor R4. Another end of the resistor R4 is grounded.

The control device 110 is constituted of a microcomputer and such and controls various operations of the ground fault detection apparatus 100 by executing a pre-embedded program. Specifically, the control device 110 individually controls the switches S1-S4 to switch the measurement paths and controls charge and discharge of the capacitor C1.

Further, the control device 110 inputs from the A/D port an analog voltage level induced in the resistor R3. The control device 110 performs a predetermined calculation based on the measured value and calculates the insulation resistance RL. Measurement data of the control device 110 and a warning indicative of detection of ground fault and such are outputted to the external control device.

The control device 110 is designed for measuring positive voltages within a predetermined measurement range of 0V-5V, for example. Thus, in the conventional ground fault detection apparatus which does not take into consideration that the capacitor C1 may be charged in the reverse direction, the values of the resistor R6 and the resistor R3 are selected such that the voltage applied to the resistor R3 falls within the range from 0V to 5V. For example, when the charge range of the capacitor C1 is from 0V to 500V, the values of the resistor R6 and the resistor R3 are selected so as to divide the voltage to be about 1/100.

However, considering that the capacitor C1 may be charged in the reverse direction, the charge range of capacitor C1 will be from −500V to 50V. At this time, the voltage applied to the resistor R3 will be in the range from −5V to 5V, which is broader than the measurement range of the control device 110.

Thus, the ground fault detection device of this embodiment uses the offset voltage divider circuit by which the range of the voltage applied to the resistor R3 that is a measurement resistor is divided and reduced, and made offset to the positive side. Consequently, in this embodiment, even when the capacitor C1 is charged with the reverse polarity that is reverse of the normal polarity, it is possible to measure the voltage by the control device 110. That is, in this embodiment, it is possible to measure the charge voltage regardless of the charge direction of the flying capacitor.

For example, by reducing the range of the voltage applied to the resistor R3 to half to provide the range from −2.5V to 2.5V and offsetting this range for 2.5V, the voltage in the range from −5V to 5V applied to the resistor R3 can be measured in the range from 0V to 5V. As described later, in order to simplify the circuit configuration, the voltage applied to the resistor R3 in the range from −5V to 5V may be measured in the range from 0V to 4V by reducing the range of the voltage applied to the resistor R3 to ⅖ and offsetting for 2V, for example. Or course, other voltage dividing ratios and offset amounts selected in accordance with the charge range of the capacitor C1 and the measurement range of the control device may also be used.

Next, an operation of the ground fault detection apparatus 100 having the above-described configuration will be explained. The ground fault detection apparatus 100 repeats a measurement operation with one cycle including a V0 measurement period, a Vcn measurement period, a V0 measurement period, a Vcp measurement period and an insulation resistance RL calculation, for example.

Figure 2:
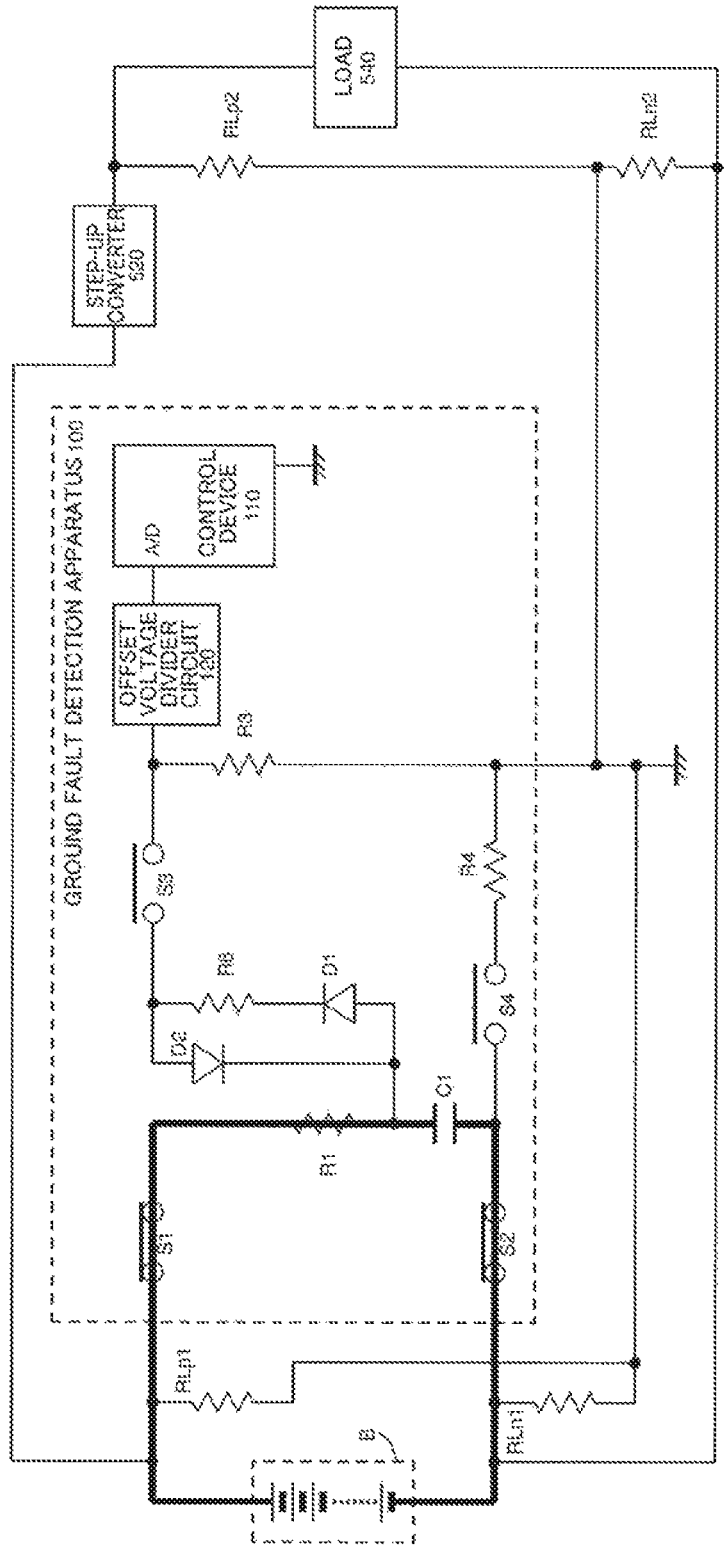
FIG. 2 is a diagram illustrating a V0 charge path.

In the V0 measurement period, a voltage V0 corresponding to a voltage of the battery B is measured. To do this, the switches S1 and S2 are turned on and the switches S3 and S4 are turned off, thereby charging for the voltage V0. At this time, as shown in FIG. 2, the battery B, the resistor R1 and the capacitor C1 are in the charge path, and the capacitor C1 is charged in a normal polarity.

Figure 3:
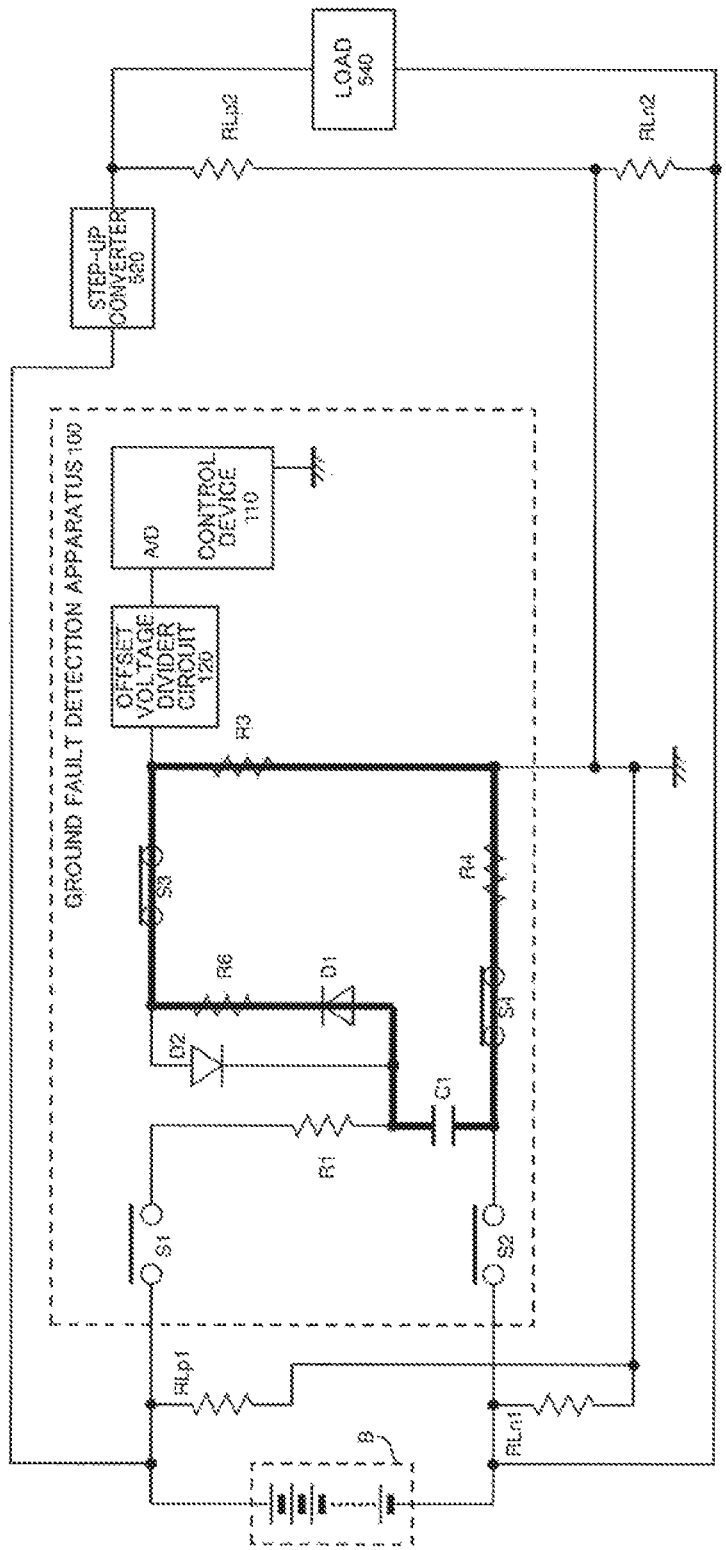
FIG. 3 is a diagram illustrating a path for charge measurement and discharging.

Then, as shown in FIG. 3, the switches S1 and S2 are turned off and the switches S3 and S4 are turned on, and V0 is measured using the control device 110. The same circuit is used to discharge the capacitor C1 for a next measurement.

Figure 4:
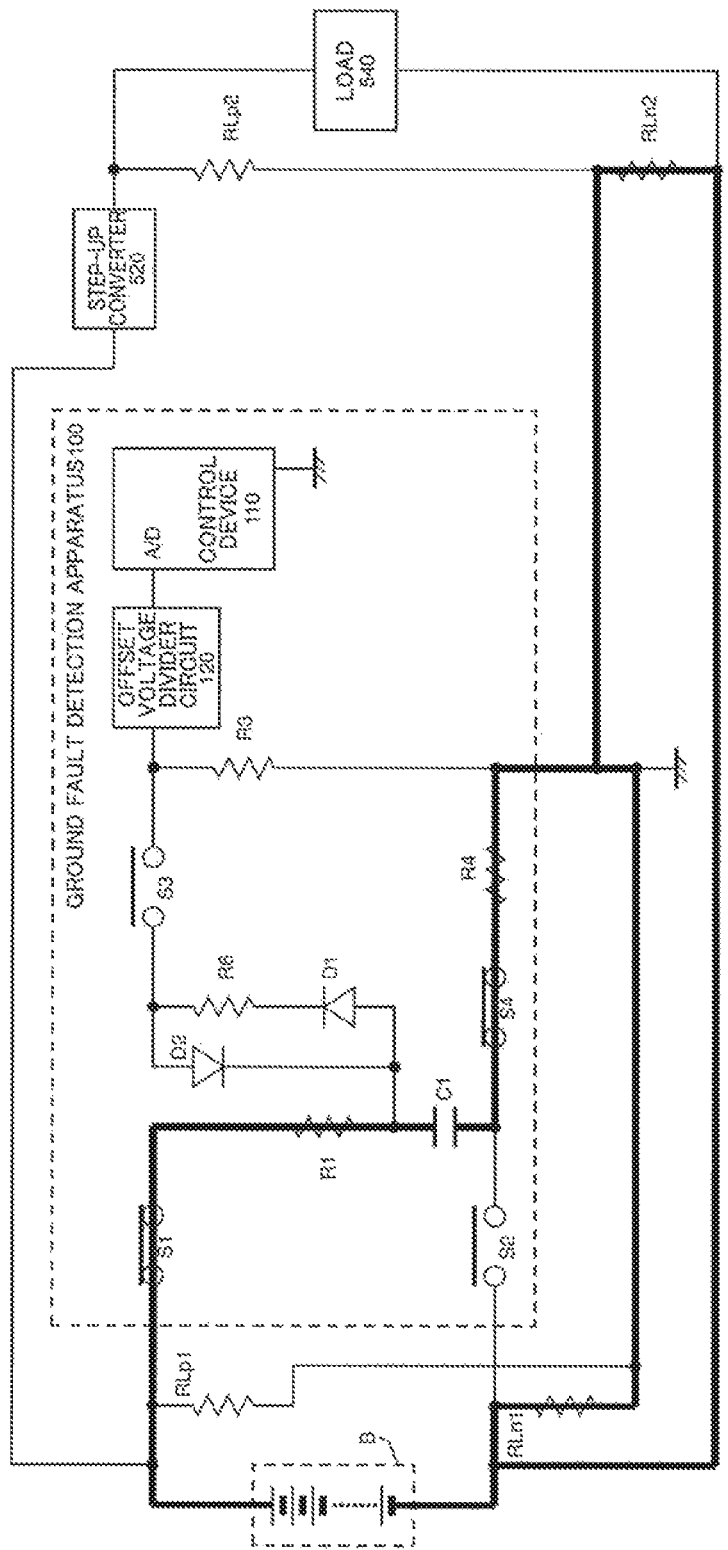
FIG. 4 is a diagram illustrating a Vcn charge path.

In the Vcn measurement period, a voltage reflecting the effect of the negative electrode-side insulation resistance RLn is measured. To do this, the switches S1 and S4 are turned on and the switches S2 and S3 are turned off, thereby charging for Vcn. At this time, as shown in FIG. 4, the battery B, the resistor R1, the capacitor C1, the resistor R4 and the negative electrode-side insulation resistance RLn are in the measurement path.

Then, as shown in FIG. 3, the switches S1 and S2 are turned off and the switches S3 and S4 are turned on, and Vcn is measured using the control device 110.

When the step-up converter 520 is performing the step-up operation, a voltage applied to the second electrode plate of the capacitor C1 is a voltage obtained by dividing a stepped-up voltage by the positive electrode-side insulation resistance RLp and the negative electrode-side insulation resistance RLn. When this voltage becomes higher than a voltage applied from the positive electrode side of the battery B, the capacitor C1 will be charged with a reverse polarity that is reverse of the normal polarity due to flowing around of current.

Figure 5:
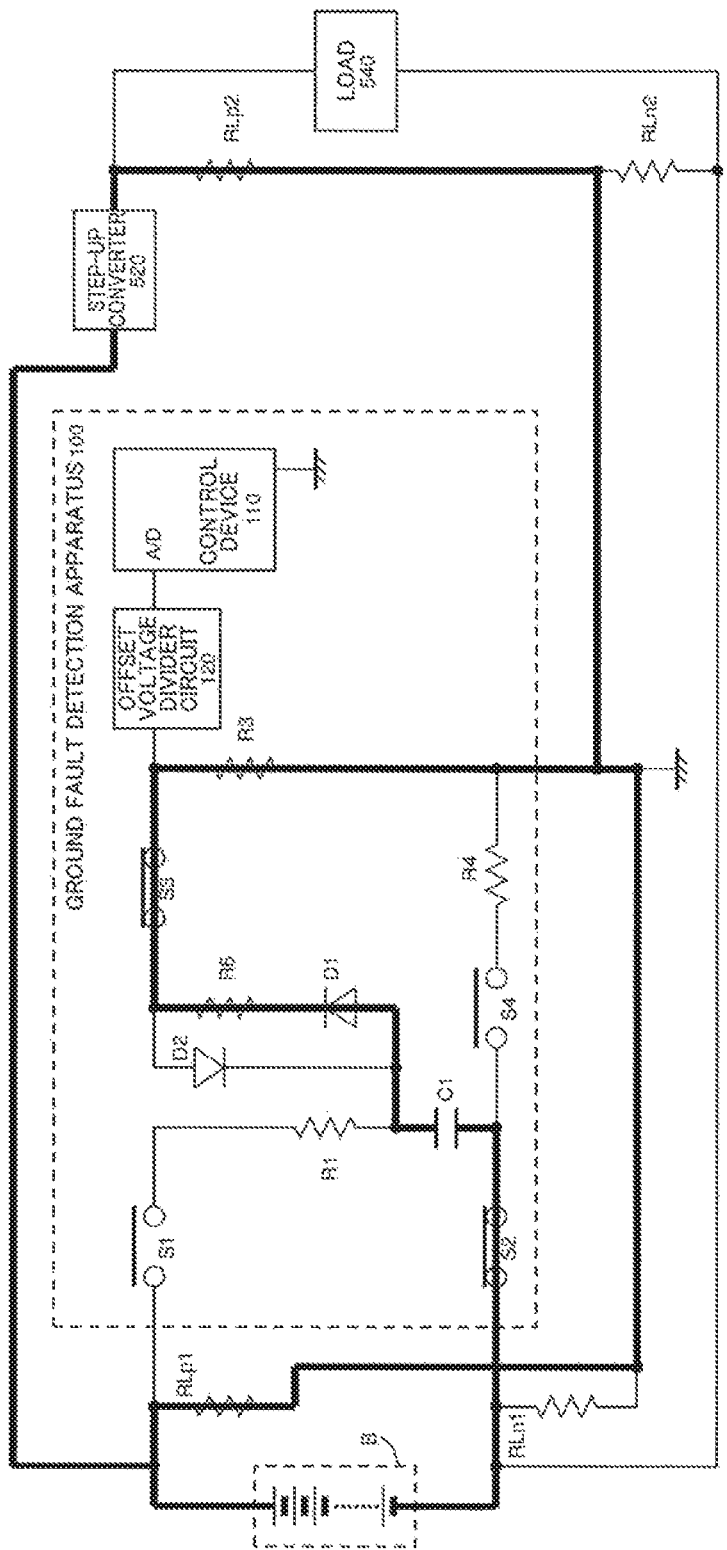
FIG. 5 is a diagram illustrating a Vcp charge path.

In the Vcp measurement period, a voltage reflecting the effect of the positive electrode-side insulation resistance RLp is measured. To do this, the switches S2 and S3 are turned on and the switches S1 and S4 are turned off, thereby charging for Vcp. At this time, as shown in FIG. 5, the battery B, the positive electrode insulation resistance RLp, the resistor R3 and the capacitor C1 are in the charge path, and the capacitor C1 is charged in the normal polarity.

Then, as shown in FIG. 3, the switches S1 and S2 are turned off and the switches S3 and S4 are turned on to measure Vcp using the control device 110. The same circuit is used to discharge the capacitor C1 for a next measurement.

Based on V0, Vcn and Vcp obtained in the above-described measurement periods, the control device 110 calculates the insulation resistance RL with referring to a pre-produced table data. Then, when the insulation resistance RL becomes equal to or less than a predetermined determination reference level, the control device 110 determines that there is a ground fault occurring and outputs a warning to the external control device.

Figure 6:
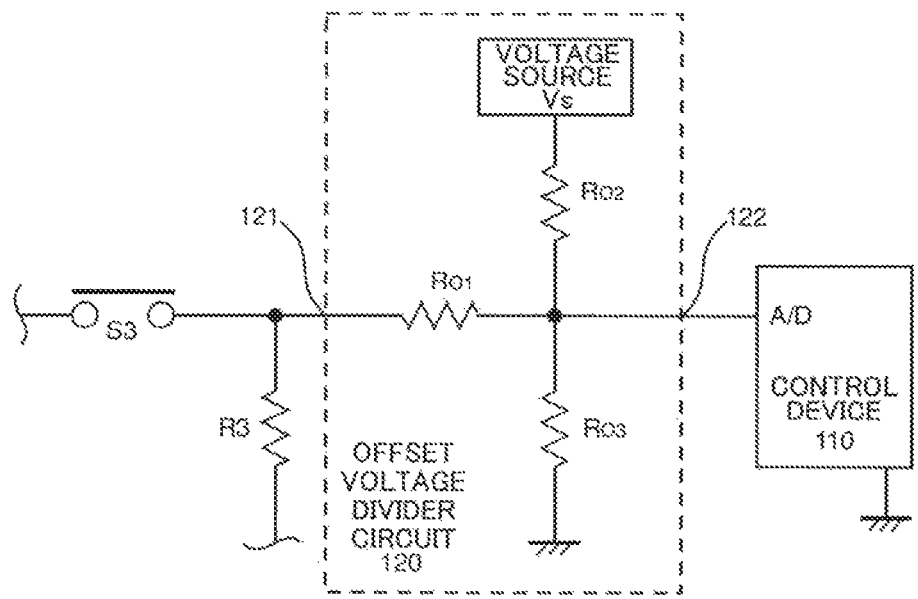
FIG. 6 is a block diagram showing an exemplary configuration of an offset voltage divider circuit according to this embodiment.

FIG. 6 is a block diagram showing a configuration example of the offset voltage divider circuit 120 according to this embodiment. The offset voltage divider circuit 120 includes an input 121 connected to a line that connects the switch S3 and the resistor R3, an output 122 connected to the control device 110, three resistors $R_{O1}$, $R_{O2}$, $R_{O3}$ and a voltage source $V_S$ for supplying a constant voltage. One end of the resistor $R_{O1}$ is connected to the input 121, and another end of the resistor $R_{O1}$ is connected to the output 122. One end of the resistor $R_{O2}$ is connected to the voltage source $V_S$, and another end of the resistor $R_{O2}$ is connected to a line that connects the resistor $R_{O1}$ and the output 122. One end of the resistor $R_{O3}$ is grounded, and another end of the resistor $R_{O3}$ is connected to the line that connects the resistor $R_{O1}$ and the output 122. In this circuit, a voltage $V_{RO3}$ applied to the resistor $R_{O3}$ is outputted from the output 122 and measured by the control device 110.

In this circuit, the voltage $V_{RO3}$ applied to the resistor $R_{O3}$ is derived using the following equation:

$$V_{RO3} = \frac{V_{R3}}{\left\{\frac{(R_{O2}+R_{O3})R_{O1}}{R_{O2}R_{O3}}+1\right\}} + \frac{V_S}{\left\{\frac{(R_{O1}+R_{O3})R_{O2}}{R_{O1}R_{O3}}+1\right\}}.$$

Thus, in this circuit, if an upper limit value of a voltage that the control device 110 can measure is Vcmax, then values of the three resistors $R_{O1}$, $R_{O2}$, $R_{O3}$ and a value of the voltage source $V_S$ for supplying a constant voltage can be set such that $0 \leq V_{RO3} \leq $Vcmax, thereby the control device 110 can measure a voltage even when the capacitor C1 was charged with the reserve polarity that is reverse of the normal polarity.

For example, in the case where R6/R3=99, when the voltage stored at the capacitor C1 varies from −500V to 500V, the voltage applied to the resistor R3 varies from −5V to 5V. Hence, if the offset voltage divider circuit 120 of this embodiment does not exist and the control device 110 directly measures the voltage applied to the resistor R3, then the voltage measured by the control device 110 becomes zero as indicated by a dotted line in FIG. 7 when the value of the voltage stored at the capacitor C1 is between −500V and 0V, thus the control device 110 cannot accurately measure the voltage applied to the resistor R3.

Figure 7:
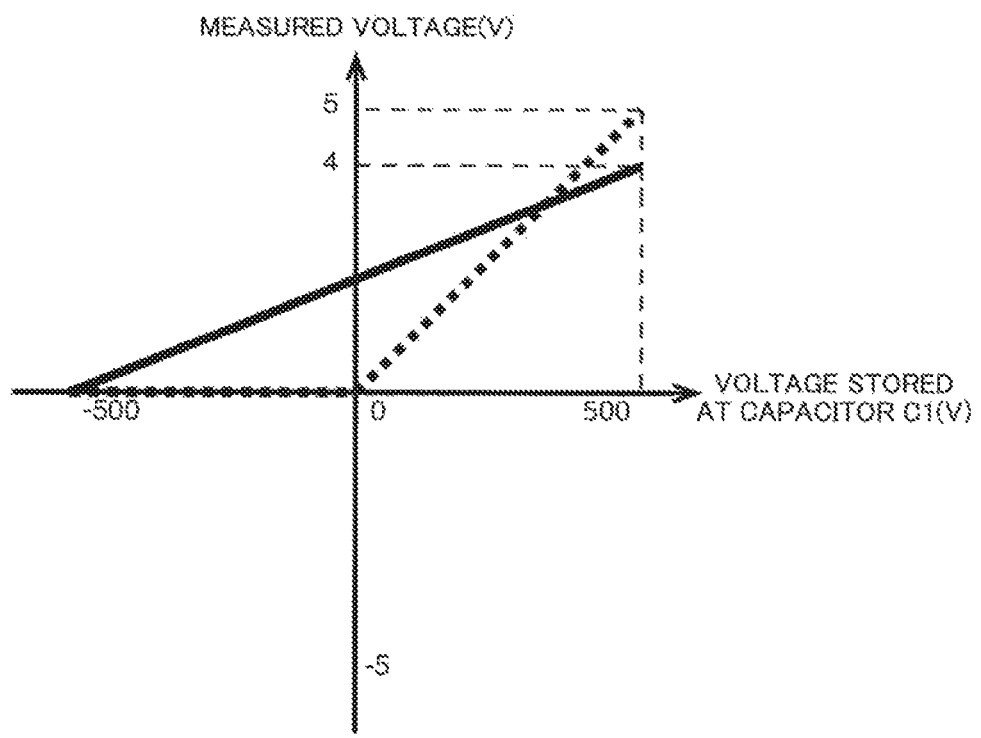
FIG. 7 is a diagram showing a relationship between a measured voltage and a voltage stored in a flying capacitor of this embodiment.
Figure 8:
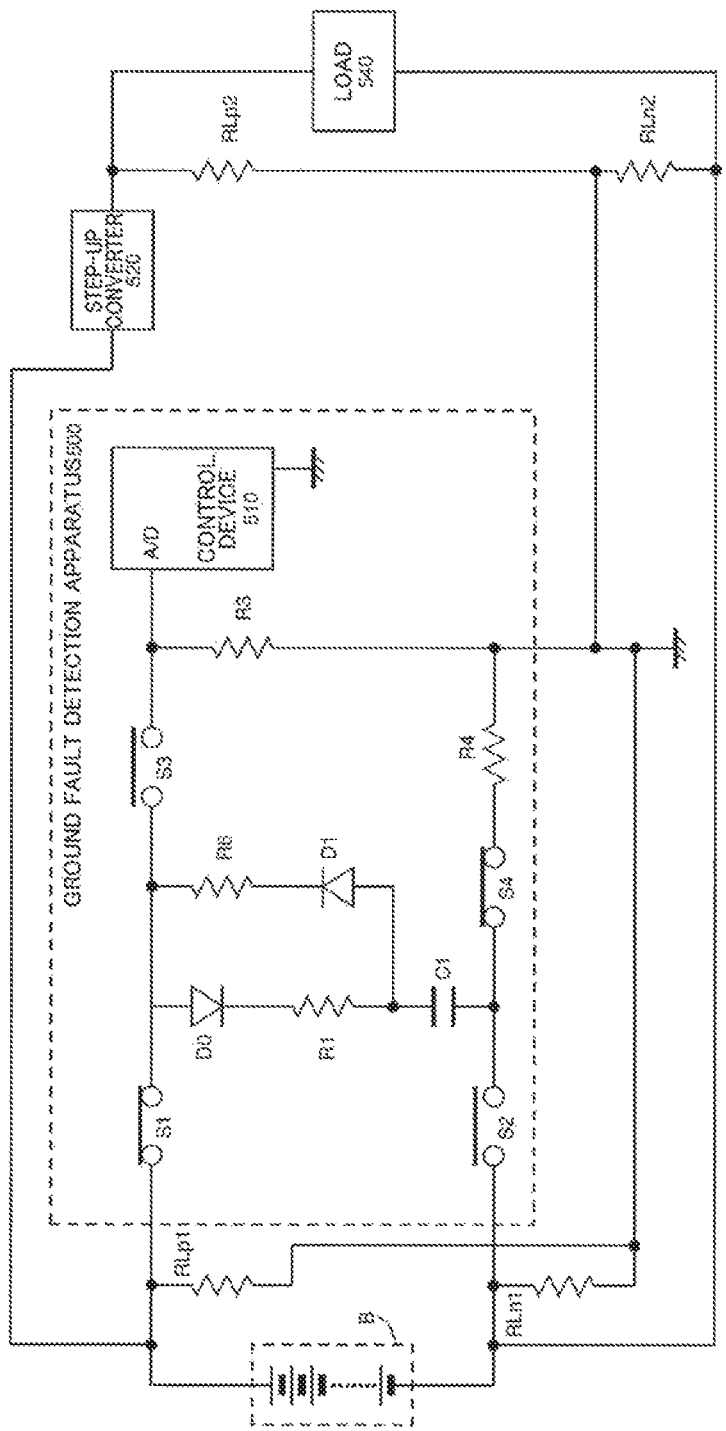
FIG. 8 is a block diagram showing an exemplary configuration of a conventional ground fault detection apparatus of a flying capacitor type.
Figure 9:
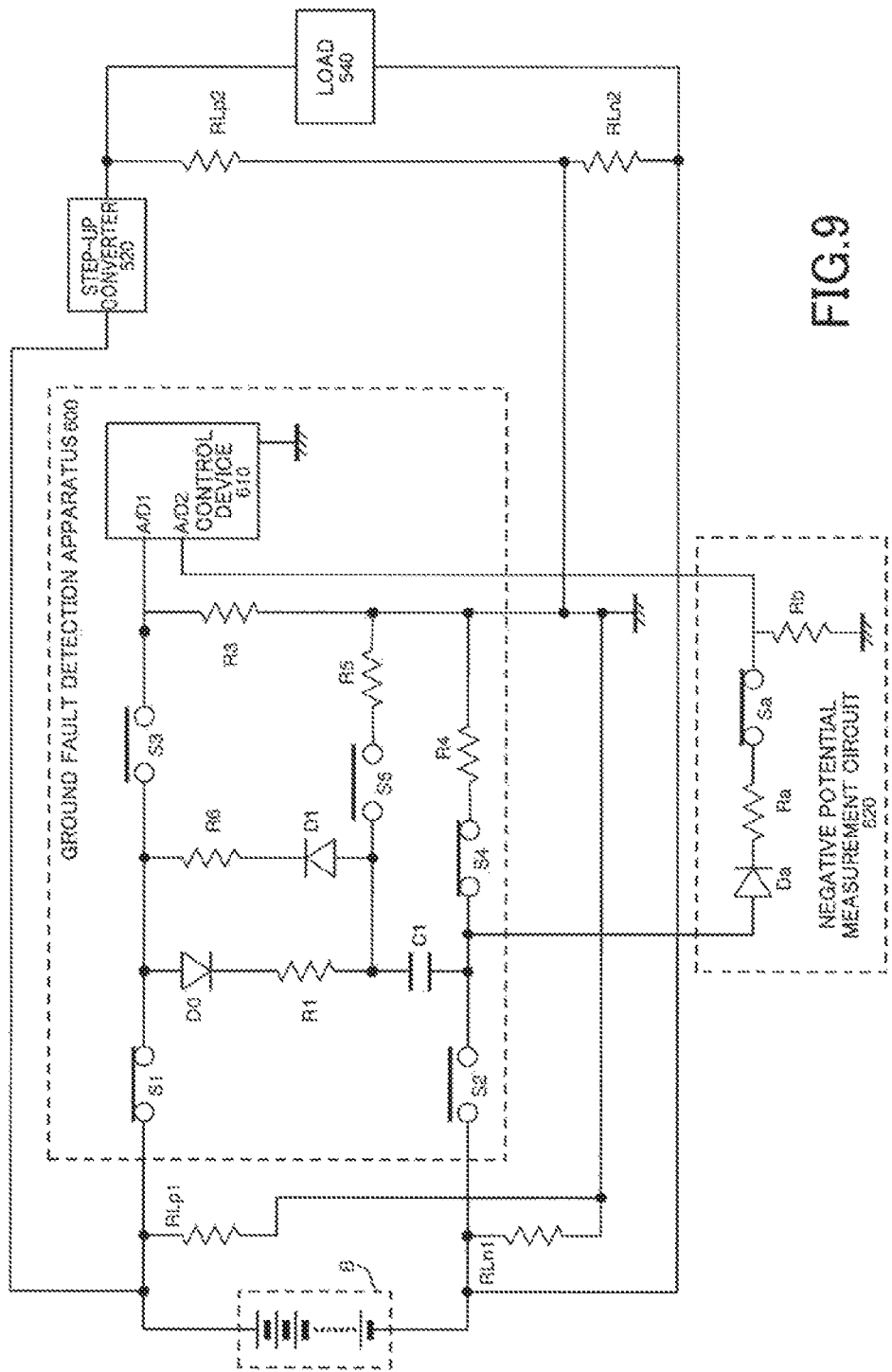
FIG. 9 is a block diagram showing a conventional configuration that enables measurement of a charge voltage even when the flying capacitor is charged with a reverse polarity.

In contrast, in this embodiment, for example when $R_{O1}=R_{O2}=R_{O3}/2$ and $V_S=5V$, the voltage $V_{RO3}$ applied to the resistor $R_{O3}$ is $(2/5)(V_{R3}+5)$. Thus, when the voltage stored at the capacitor C1 is in the range from −500V to 500V and the voltage applied to the resistor R3 is between −5V to 5V, the voltage $V_{RO3}$ applied to the resistor $R_{O3}$ is between 0V and 4V. That is, in this embodiment, even when the voltage stored at the capacitor C1 is negative, the voltage $V_{RO3}$ applied to the resistor $R_{O3}$ will be positive not negative and be below 5V. Thus, in this embodiment, as shown in FIG. 7 by a solid line, even when the value of the voltage stored at the capacitor C1 is between −500V and 0V, the control device 110 can accurately measure the voltage. That is, in this embodiment, even when the capacitor C1 is charged with the reverse polarity that is reverse of the normal polarity, the voltage can be measured by the control device 110. That is, in this embodiment, the charge voltage can be measured regardless of the charge direction of the flying capacitor.

Here, the resistor $R_{O3}$ may be constituted of two resistors $R_{O32}$, $R_{O32}$ connected in series and having the same resistance value. In this case, the relationship between the resistors will be $R_{O1}=R_{O2}=R_{O32}=R_{O32}$, so the offset voltage divider circuit can be constituted of four resistors having the same resistance value, allowing to provide the offset voltage divider circuit 120 having high accuracy.

The offset voltage divider circuit 120 shown in FIG. 6 is just one example and the offset voltage divider circuit may have other circuit configuration. For example, the voltage at the input may be divided using two resistors, and an adder circuit constituted of an operational amplifier may be used to offset the voltage.

The present invention has been described above with reference to a preferred embodiment of the present invention. Thus, although there have been described particular examples of the present invention, various modifications and changes can be made without departing from the scope of the present invention set forth in the following claims.

LIST OF REFERENCE SIGNS 100 ground fault detection apparatus
110 control device
120 offset voltage divider circuit
520 step-up converter
540 load

What is claimed is:

1. A ground fault detection apparatus configured to be connected to an ungrounded battery for supplying power to a load via a step-up circuit, and configured to detect a ground fault by calculating an insulation resistance of a system provided with the battery, the ground fault detection apparatus comprising:
   a capacitor configured to operate as a flying capacitor;
   a set of switches configured to switch between a first voltage (V0) charge path including the battery and the capacitor, a second voltage (Vcn) charge path including the battery, the capacitor and a negative electrode-side insulation resistance as an insulation resistance between a negative electrode side of the battery and a ground, a third voltage (Vcp) charge path including the battery, the capacitor and a positive electrode-side insulation resistance as an insulation resistance between a positive electrode side of the battery and the ground, and a charge voltage measurement path including the capacitor and a measurement resistor;
   an offset voltage divider circuit that divides and offsets a voltage produced at the measurement resistor; and
   a control device configured to
      control the set of switches and
      calculate the insulation resistance using an output voltage of the offset voltage divider circuit as a measured value, based on a first voltage (V0) which is a value measured at the first voltage (V0) charge path, a second voltage (Vcn) which is a value measured at the second voltage (Vcn) charge path and a third voltage (Vcp) which is a value measured at the third voltage (Vcp) charge path.

2. The ground fault detection apparatus as claimed in claim 1, wherein
   the offset voltage divider circuit includes:
   an input to which a voltage produced at the measurement resistor is inputted;
   an output that outputs the output voltage;
   a first resistor connected between the input and the output;
   a voltage source that supplies a constant voltage;
   a second resistor having one end connected to the voltage source and another end connected to a line that connects the first resistor and the output; and
   a third resistor having one end grounded and another end connected to the line that connects the first resistor and the output.

3. The ground fault detection apparatus as claimed in claim 2, wherein
   the third resistor is constituted of two resistors, and
   a resistance value of the first resistor, a resistance value of the second resistor, and each resistance value of each of the two resistors constituting the third resistor are equal.

* * * * *